(12) United States Patent  
Barabi et al.

(10) Patent No.: US 8,653,842 B2  
(45) Date of Patent: *Feb. 18, 2014

(54) SYSTEMS AND METHODS FOR THERMAL CONTROL OF INTEGRATED CIRCUITS DURING TESTING

(75) Inventors: Nasser Barabi, Lafayette, CA (US); Chee Wah Ho, Fremont, CA (US); Joven R. Tienzo, Fremont, CA (US); Oksana Kryachek, San Francisco, CA (US); Elena V. Nazarov, San Mateo, CA (US)

(73) Assignee: Essai, Inc., Fremont, CA (US)

( * ) Notice: Subject to any disclaimer, the term of this patent is extended or adjusted under 35 U.S.C. 154(b) by 358 days.

This patent is subject to a terminal disclaimer.

(21) Appl. No.: 13/081,439

(22) Filed: Apr. 6, 2011

(65) Prior Publication Data

US 2011/0214843 A1 Sep. 8, 2011

Related U.S. Application Data

(63) Continuation-in-part of application No. 12/957,306, filed on Nov. 30, 2010.

(60) Provisional application No. 61/265,285, filed on Nov. 30, 2009.

(51) Int. Cl.  
*G01R 31/00* (2006.01)

(52) U.S. Cl.  
USPC ............ 324/750.03; 324/750.04; 324/750.06; 324/750.08; 324/750.09; 165/104.33

(58) Field of Classification Search  
USPC .............................. 324/750.03–750.09, 755, 324/760.01–765.01; 165/104.33  
See application file for complete search history.

(56) References Cited

U.S. PATENT DOCUMENTS

| | | | | |
|---|---|---|---|---|
| 7,663,388 | B2* | 2/2010 | Barabi et al. | 324/750.11 |
| 2008/0207037 | A1* | 8/2008 | Barabi et al. | 439/331 |
| 2008/0252324 | A1* | 10/2008 | Barabi et al. | 324/760 |
| 2011/0011564 | A1* | 1/2011 | Ooi et al. | 165/104.19 |

* cited by examiner

*Primary Examiner* — Arleen M Vazquez  
*Assistant Examiner* — Son Le  
(74) *Attorney, Agent, or Firm* — Kang S. Lim

(57) ABSTRACT

Thermal control units (TCU) for maintaining a set point temperature on an IC device under test (DUT) are provided. The units include a pedestal assembly comprising a heat-conductive pedestal, a fluid circulation block, a thermoelectric module (Peltier device) between the heat-conductive pedestal and the block for controlling heat flow between the pedestal and fluid circulation block, and a force distribution block for controllably distributing a z-axis force between different pushers of the TCU. Alternatively, instead of a thermoelectric module, a heater can provide heat to the DUT. Optionally, a swivelable temperature-control fluid inlet and outlet arms may be provided to reduce instability of the thermal control unit due to external forces exerted on the TCU such as by fluid lines attached to the fluid inlet and outlet arms. Also optionally, an integrated means for abating condensation on surfaces of the TCU during cold tests may be provided.

9 Claims, 13 Drawing Sheets

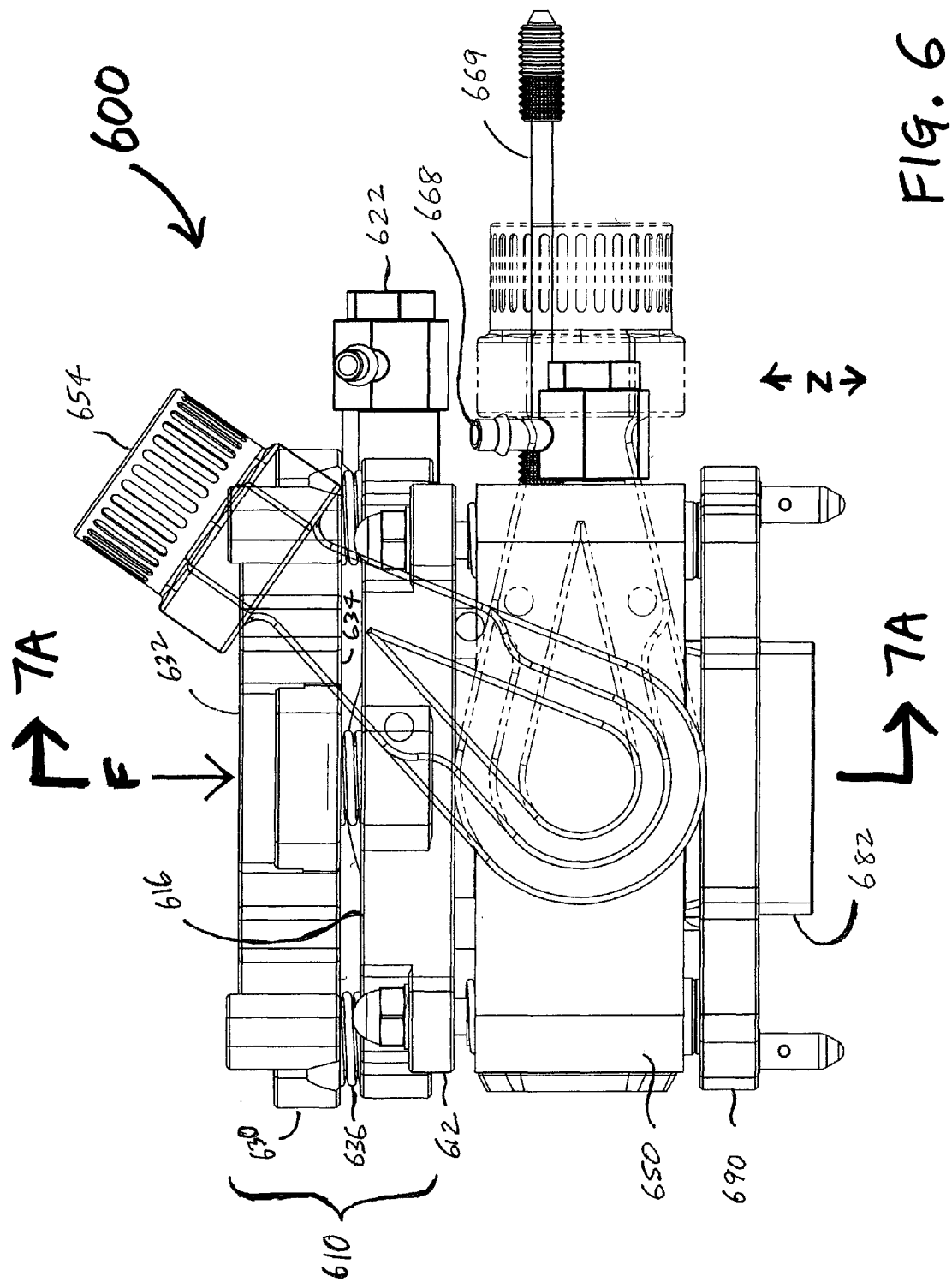

SYSTEMS AND METHODS FOR THERMAL CONTROL OF INTEGRATED CIRCUITS DURING TESTING

CROSS REFERENCE TO RELATED APPLICATIONS

This is a continuation-in-part and claims benefit of U.S. application Ser. No. 12/957,306 filed on Nov. 30, 2010, entitled "Improved Thermal Control Unit Used to Maintain the Temperature of IC Devices Under Test", which claims benefit of U.S. Provisional Patent Application No. 61/265,285 filed Nov. 30, 2009, both applications are hereby fully incorporated by reference.

BACKGROUND

The present invention generally relates to the testing of IC devices such as packaged semiconductor chips (also referred to as packaged dies), and more particularly relates to devices for maintaining the temperature of an integrated circuit (IC) device under test (DUT) in various packages.

Thermal control units have been devised to test packaged IC chips under conditions in which the DUT's temperature is raised, maintained, or lowered during the course of the test. Such units provide thermal contact with the DUT and carry heat away from or add heat to the DUT as required based on a predetermined set point temperature. Such units frequently use a peltier device as a heat pump to achieve such temperature control. Peltier devices are solid-state devices that come in small thin geometries and that can be controlled by a DC current to pump heat away from a contacted device for removal. By reversing the current, the peltier device acts as a heater by pumping heat into a contacted device.

Alternatively, a thermally-conductive electrically-resistive heater can be used to rapidly heat up the DUT, and then rapidly cool down the DUT in combination a (cooling) fluid block, via conduction through the heater.

In thermal control units for IC testing, the ability of the peltier device or the heater to efficiently transfer heat to and away from the DUT is affected by the contact between the peltier device and the other components of the thermal control unit, including the thermal sensor containing pedestal that contacts the DUT. Efficient heat transfer requires large forces pushing the heat transfer surfaces of the peltier device or heater, typically forces that exceed 100 pounds per square inch. The rigid mechanical designs heretofore used in DUT thermal control units to generate these required clamping forces tend to cause the components of the unit to bend or bow in a manner that interferes with thermal contacts made with the peltier device or heater, resulting in degradation of the device's heat transfer capabilities.

Some attempts have been made to overcome these problems. For example, U.S. Pat. No. 7,663,388 Barabi et al. describes a thermal control unit (TCU) for maintaining the set point temperature of an IC device under test (DUT). The TCU has a thermoelectric module (a peltier device), a temperature-control fluid block, a lower pedestal assembly containing a thermal sensor, and an upper cover housing arranged in a stacked relationship along the z-axis of the TCU. A z-axis compliant force is supplied from the TCU's cover housing by means of a spring-type pusher mechanism that supplies a compliant spring force to the stacked arrangement of the fluid block, peltier device, and pedestal assembly. The z-axis compliant force provided by the spring-type pusher mechanism produces efficient thermal contact between the peltier device and the stacked components of the TCU containing the peltier device and allows the peltier device to expand and contract within the TCU to extend the life of the peltier device.

In addition, DUTs may be held in a manner that achieves efficient electrical contact between the I/O contact array of an IC device and the conductor pads of a circuit board. U.S. Pat. No. 7,651,340 to Barabi et al., for example, describes an IC socket cover assembly capable of producing and maintaining precise actuating forces on an IC chip package and capable of efficiently dissipating heat produced by a chip. The assembly includes a pedestal assembly spring-mounted to the bottom of a carrier housing and side leaf springs or other similar force transferring means on the pedestal assembly which transmit a z-axis force to the corner regions of the pedestal assembly for advancing the pedestal assembly in the z-axis direction against an IC chip in the IC socket. The compliance of the leaf springs maintains a constant and precise actuating force on the IC chip when the IC chip is contacted by the pusher end portion or portions of the pedestal assembly. Front, back, and sides of the carrier housing may define a central cavity region above the pedestal assembly for permitting air flow through the carrier housing to improve the heat dissipation capability of the cover assembly.

As described below, the present invention provides improvements to TCUs in the areas of (1) load control and balancing, e.g., to test bare die packages in a manner that ensures application of appropriate compliant forces to different portions of the packages so as to avoid damaging the die, (2) TCU stability during test, and (3) condensation abatement for surfaces of the TCUs susceptible to water or ice accumulation during cold testing.

BRIEF DESCRIPTION OF THE DRAWINGS

In order that the present invention may be more clearly ascertained, some embodiments will now be described, by way of example, with reference to the accompanying drawings, in which:

FIG. 6 is a side view of another exemplary embodiment of a thermal control unit in accordance with the present invention.

FIG. 7A is cross-sectional view thereof taken along section lines 7A-7A in FIG. 6, while

DETAILED DESCRIPTION

Figure 1:
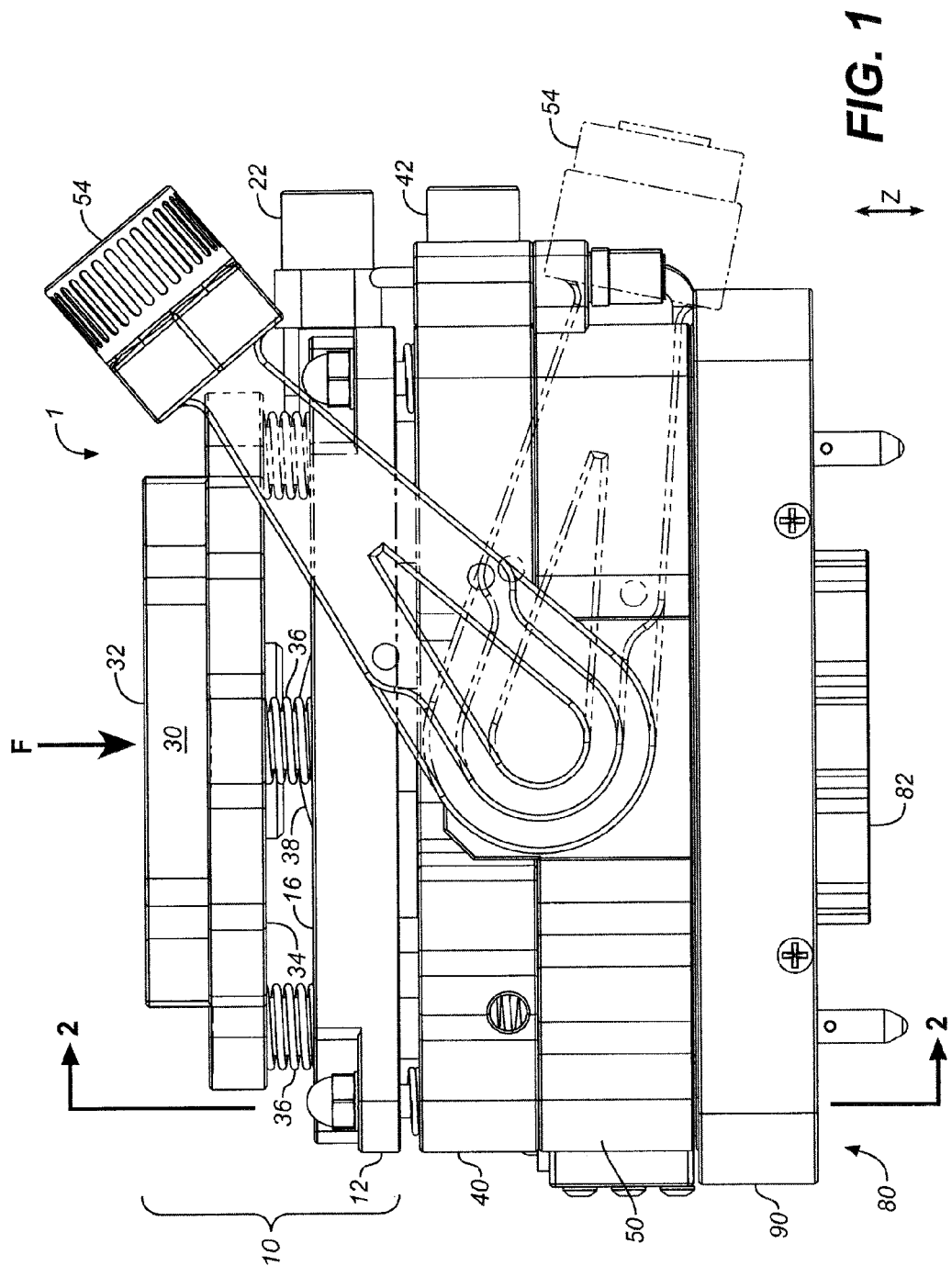
FIG. 1 is a side view of an exemplary thermal control unit that includes a z-axis force balancing mechanism in accordance with one aspect of the invention.

The present invention will now be described in detail with reference to several embodiments thereof as illustrated in the accompanying drawings. In the following description, numerous specific details are set forth in order to provide a thorough understanding of embodiments of the present invention. It will be apparent, however, to one skilled in the art, that embodiments may be practiced without some or all of these specific details. In other instances, well known process steps and/or structures have not been described in detail in order to not unnecessarily obscure the present invention. The features and advantages of embodiments may be better understood with reference to the drawings and discussions that follow.

Before describing the present invention in detail, it is to be understood that the invention is not limited to the TCU illustrated herein. It is also to be understood that the terminology used herein is for describing particular embodiments only, and is not intended to be limiting.

In addition, as used in this specification and the appended claims, the singular article forms "a," "an," and "the" include both singular and plural referents unless the context of their usage clearly dictates otherwise. Thus, for example, reference to "a piston" includes a plurality of springs as well as a single piston, reference to "an outlet" includes a single outlet as well as a collection of outlets, and the like.

In general, the invention relates to thermal control units (TCUs) that may be used to maintain a set point temperature on an IC device under test (DUT). The TCU can suitably include features common to those described in U.S. Pat. No. 7,663,388, which is incorporated herein by reference. Such features would include, in a z-axis stacked arrangement, a heat-conductive pedestal for contacting the DUT and containing a thermal sensor, a fluid circulation block, and a thermoelectric module (a Peltier device) or heater between the heat-conductive pedestal and the fluid circulation block for pumping heat away from the DUT and into the fluid circulating block (or for pumping heat into DUT). The common features would also include in the z-stack arrangement a spring loaded pusher mechanism for exerting a z-axis force compliant force that holds the fluid block, thermoelectric module (or heater) and heat conducting pedestal tightly together.

The TCUs in accordance with the invention may be used on DUTs of different constructions. For example, the TCU may be used with IC devices having a lidded package that employs an integrated heat spreader (IHS) or with IC devices having a bare die chip package.

One aspect of the invention is directed to TCUs having different pushers used to push against different parts of a chip package. In this aspect of the invention, a z-axis load distribution system is provided for controllably distributing the total z-axis force applied to from the top of the TCU between different pushers so that a desired balance can be achieved for the exerted by the different pushers. For example, when a die pusher/pedestal and a substrate pusher are used in conjunction with bare die chip packages, the z-axis forces applied the die pusher/pedestal can be adjusted relative to with the pushing force applied by the substrate pusher to balance the loads on the die and substrate of the bare die package.

In another and separate aspect of the invention, at least one and preferably both the fluid inlet and/or fluid outlet for the fluid circulation block are swivelable, preferably about a swivel axis that is substantially perpendicular to the z-axis of the TCU. The swivel capability of the fluid inlet and outlet acts to reduce instability of the thermal control unit in response to z-axis movement of the temperature-control fluid block.

In a further and separate aspect of the invention, a means for abating condensation is provided. Such means includes a condensation-abating gas inlet and condensation-abating gas transporting passageways in the thermal control unit near surfaces of the thermal control unit on which condensation may occur.

An exemplary embodiment of a TCU in accordance with the invention is illustrated by FIGS. 1-5.

The thermal control unit 1 includes the following basic sections arranged in stacked relationship along the z-axis of the TCU: a force transmitting section 10 for transmitted a z-axis force denoted by the arrow F in FIG. 1 to the TCU's DUT contacting pushers as hereinafter described; an inner spring loaded pusher block section 40; a fluid circulation block section 50; a thermoelectric module (hereinafter Peltier device) section 60; and a heat conductive pedestal section 72 having a pusher end 76, which contains a temperature sensor 78, for contacting and pushing against a thermally active central portion of an IC chip, such as the die 104 of a bare die chip package 100. An outer pusher structure is also provided. This pusher structure, denoted by the numeral 80, includes a rigid bottom pusher plate 81 and is suitably fabricated of a metal material, such as aluminum, for rigidity. The bottom pusher plate has a center opening to allow the pusher end of the heat conducting pedestal to project through the pusher plate. A second DUT contacting pusher 82 extends from the bottom of the pusher plate around this center opening. This second pusher extends in the z-axis direction in parallel with the pusher end of the pedestal and contacts and pushes against another part of the IC chip, such as the substrate 102 of the bare die chip package.

The outer pusher structure additional includes a skirt 90 secured around the outer perimeter of the bottom pusher plate 81 and that extends upward in the z-axis direction.

Figure 3:
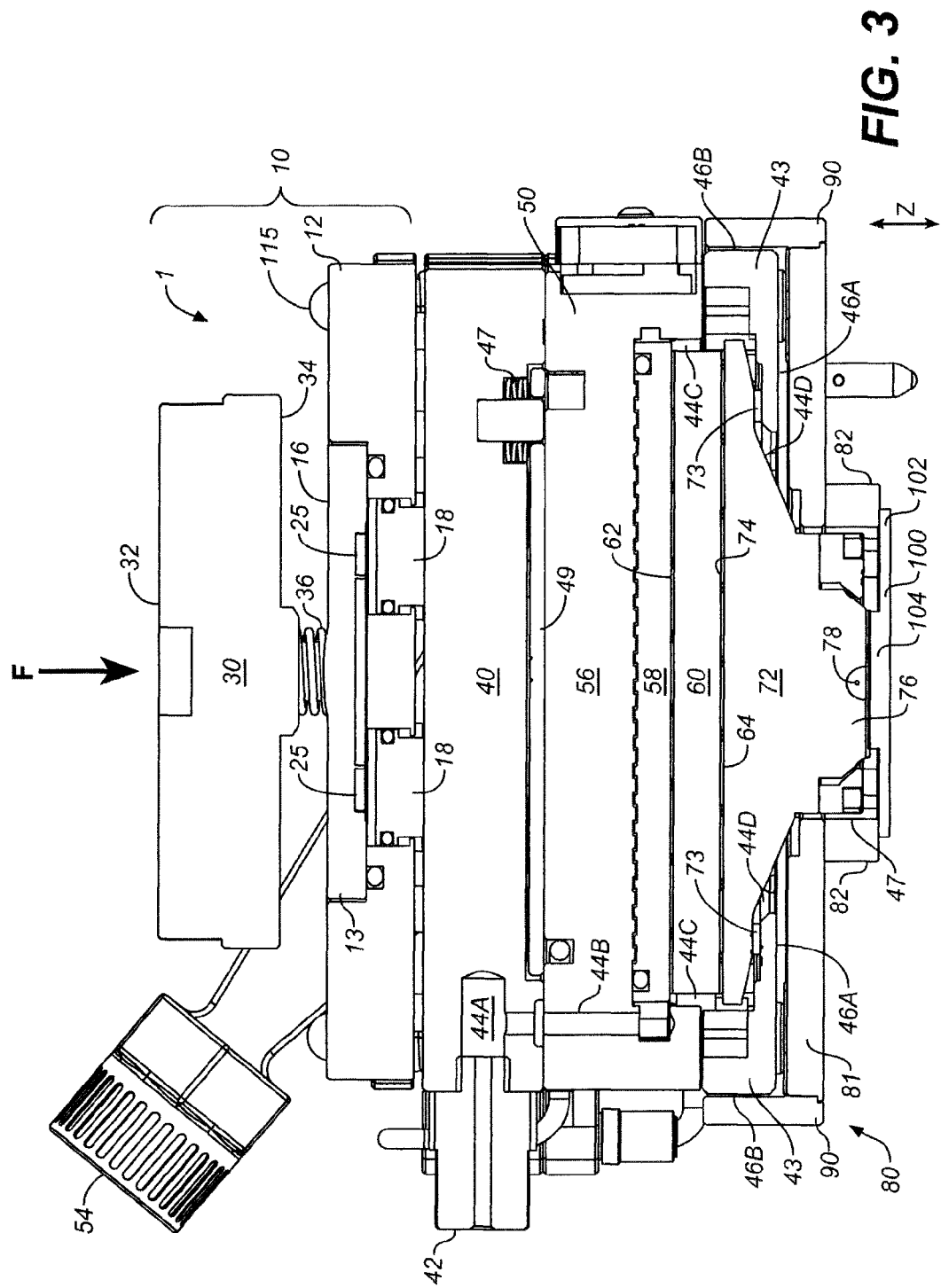
FIG. 3 is another cross-sectional view thereof taken along section lines 3-3 in FIG. 2.

Referring to FIG. 3, the fluid circulation block section 50 is seen to have a lower contact plate 58 at the bottom of block's main body 56. This lower contact plate is made of a good heat conductor such as copper and is suitable provided to achieve efficient heat conduction between the fluid circulation block section and the thermoelectric module 60. The upper section 56 of the may be formed from material that does not conduct heat as well as copper or other metals.

The force transmitting section 10 of the TCU includes a force distribution block 12 and can additionally include a gimbal adapter 30 above the force distribution block to form a gimbal. The gimbal adapter 30 includes a top coupler part 32 having upper and lower surfaces 32 and 34, with the upper surface of the coupler part being positioned to receive the indicated z-axis force F. The gimbal adaptor further includes springs 36 positioned beneath the lower surface of the top coupler part of the gimbal adaptor at the corners of the coupler part. Springs 36 are held in compression between the adaptor's coupler part and the upper surface 16 of the force distribution block 12 for preload gimbal stability.

Figure 2:
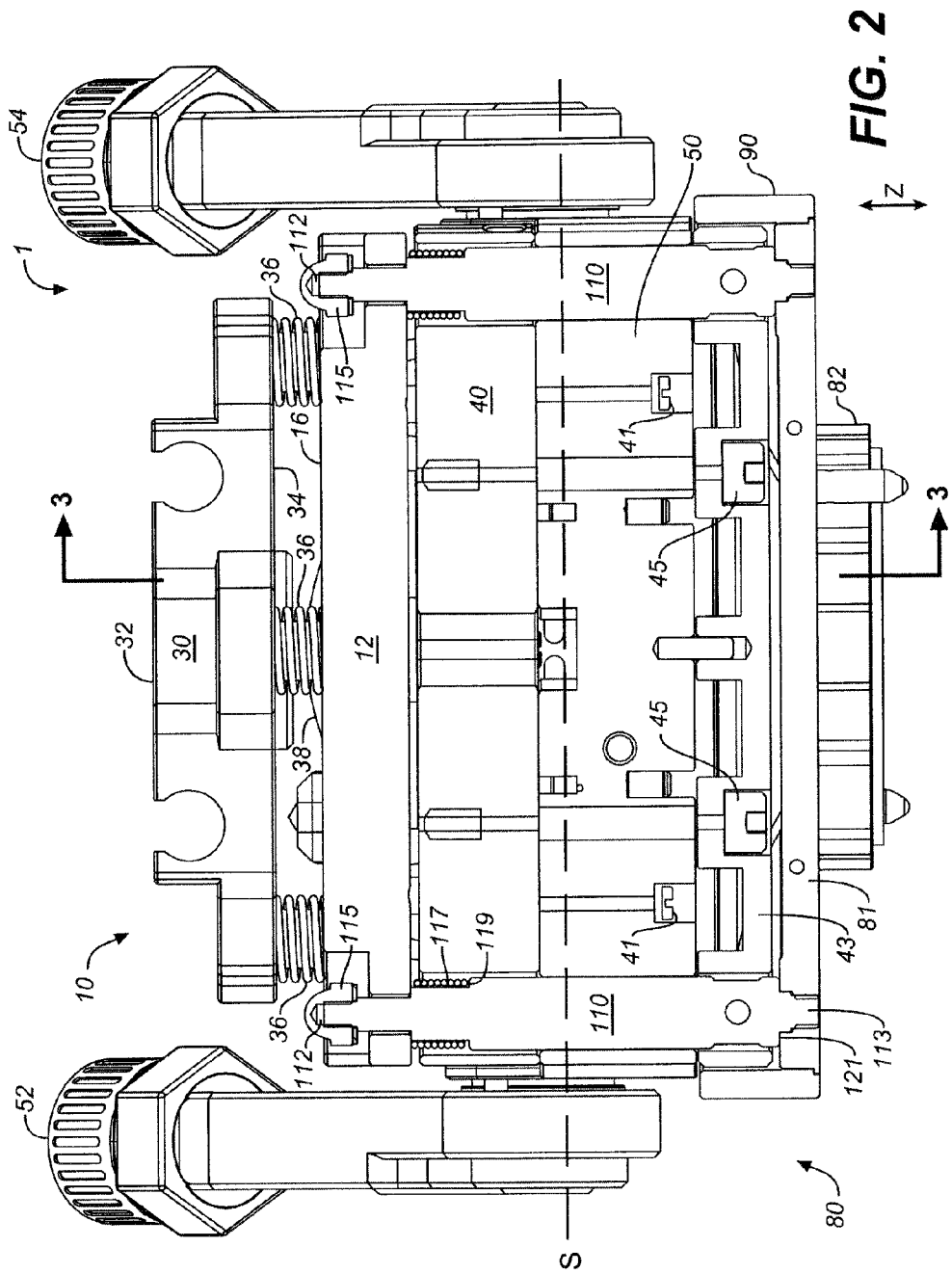
FIG. 2 is a cross-sectional view thereof taken along section lines 2-2 in FIG. 1.

As best seen in FIG. 2, the outer pusher structure is secured to the force distribution block 12 by force transfer shafts 110. These shafts freely pass through suitably sized holes in the inner spring loaded pusher block and fluid circulation block sections 40, 50. The bottom ends 113 of shafts 110 are suitably anchored to the pusher plate 81 near the outer perimeter of the plate, such as by threaded engagement, while the top ends 112 of the shafts extend through openings 20 (shown in FIG. 4) in the corners of the force distribution block and are topped by cap nuts 115 to retain the force distribution block on the shafts. As shown in FIG. 2, the force distribution block is compliantly supported on springs 117 provided around the recessed portion of the shaft beneath the force distribution block and which set on shoulders 119 presented by the recessed portion of the shaft. A z-axis force F applied to the force transmitting section 10 will thus be compliantly transmitted to pusher 82 of the outer pusher structure, and thus to the substrate 102 of bare die chip package 100. The springs can be used to pre-load the force distribution block to the inner pusher spring loaded block 40.

It is noted that bottom shoulders 121 are provided near the bottom end 113 of each of the force transfer shafts 110. These shoulders rest against the rigid pusher plate 81 to maintain the perpendicularity of the shafts.

The z-axis force F is transmitted to the die 104 of bare die chip package 100 through the stacked thermal control sections of the TCU, namely, the inner spring loaded pusher block section 40, the fluid circulation block section 50, the Peltier device 60, and the heat conductive pedestal section 72, all of which must be secured together. As best seen in FIG. 2, the fluid circulation block section 50 can be pre-attached to the inner pusher block section by suitable fasteners such as screw fasteners 41. A pedestal retainer ring 43 can be provided at the bottom of the stacked thermal control sections, and retaining fasteners, such as screw fasteners 45, can be used in conjunction with this retainer ring to tie the pedestal 72 and the other thermal control sections 40, 50 and 60 together. As generally described in U.S. Pat. No. 7,663,388, this creates a stacked assemblage of thermal control sections held in tight thermal contact with one another by the compliant z-axis force exerted by springs (such as the spring 47 shown in FIG. 3) captured in the inner pusher block 40 behind the block's pusher plate 49. As shown in FIG. 3, the pedestal 72 sets into retainer ring 43 on top of insulation ring 73. This insulation ring can have notches or passages that allow a condensation abatement gas to flow through the insulation ring as hereinafter described.

The force transmitted to the pusher end of pedestal 72 is uniquely controlled by means in the force distribution block 12, which can be actuated to change the force transmitted to the thermally active part of the DUT through the pedestal relative to the force transmitted to another part of the DUT through the outer pusher structure parts 80, 82.

Figure 4:
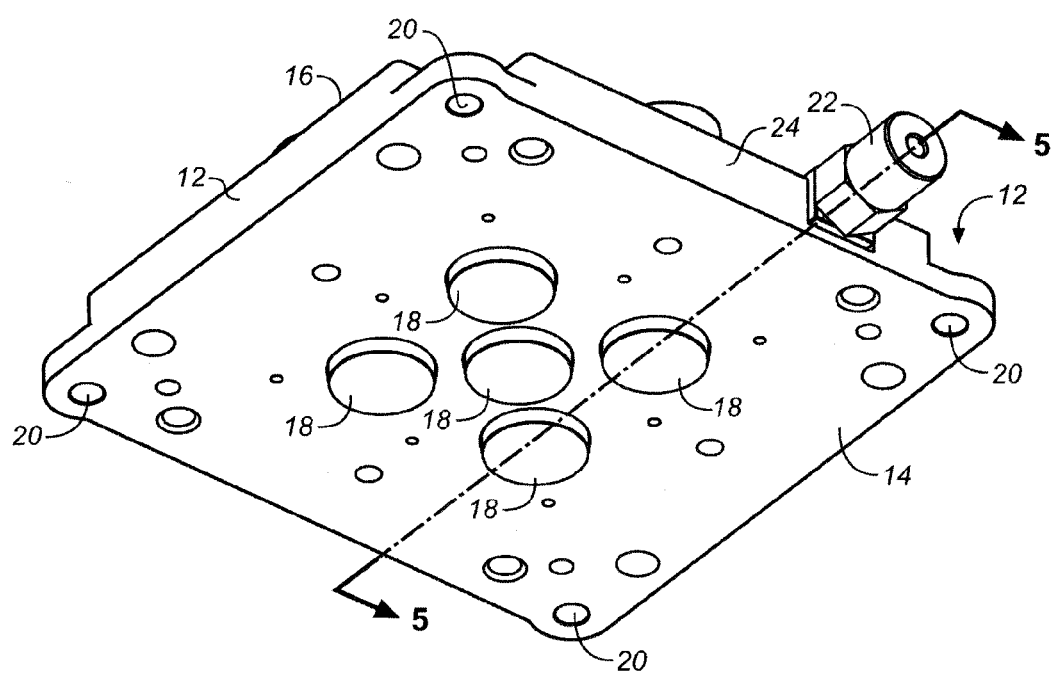
FIG. 4 is a bottom perspective view of the z-axis load distributor actuator block of the z-axis force distribution system of the TCU shown in FIGS. 1-4.
Figure 5:
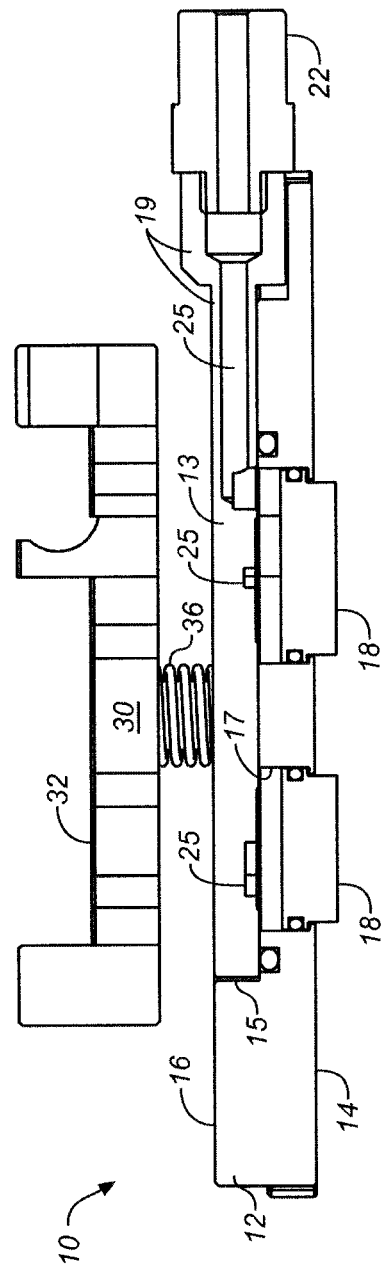
FIG. 5 is a cross-sectional view of the load distributor actuator block shown in FIG. 4 along the line 5-5, in combination with a spring loaded gimbal.

Referring to FIGS. 4 and 5, the force changing actuation means for the force distribution block can be provided in the form of at least one and preferably a plurality of pistons 18 nested in bottom surface 14 of the z-axis force distribution block 12. Pistons 18, which are preferably evenly spaced in a grouping centered in the bottom to the force distribution block 12, protrude from piston holes 17 in the bottom of block and can be actuated in the z-axis direction by altering fluid pressure behind the pistons. Fluid pressure is provided to the pistons from inlet 22 which protrudes from a side wall 24 of the force distribution block 12.

As shown in FIG. 5, the inlet 22 fluidly communicates with the pistons 18 via fluid passageways 25 within the force distribution block 12. The inlet may be connected to a source of pressured gas or fluid to effect pneumatic actuation of the pistons. Although pressured air is typically used, the pressured fluid may be nongaseous as well. For example, oils, water, or aqueous solutions may be used to actuate the piston. The result is pistons that produce a z-axis force that can be adjusted on the fly. By adjusting the pressures behind the pistons, the force transferred to the heat conducting pedestal 72 relative to the force transmitted to the outer pusher 82 can be modified during testing of the DUT without unloading or disassembling the thermal control unit. Alternatively, the adjustable pistons may be preset before use.

The z-axis force distribution block 12 can be constructed for ease of loading the pistons 18 in the block by providing a top cover plate 13 that fits in a recess 15 in the top surface 16 of the block. The top cover plate 16 can be secured in this recess by any suitable means such as by screw fasteners. The fluid passageways that are in communication with the piston holes 17 can be formed on the underside of the block. The fluid inlet 22 can be a fluid line coupler attached, such as by a threaded attachment, to a fluid inlet extension 19 of top cover plate 13.

The fluid circulation block 50 constructed fluid passages that enable fluids to be circulated through the block and carry heat away from the pedestal that contacts the thermally active part of the DUT, such as described in U.S. Pat. No. 7,663,388. In accordance with one aspect of the invention, fluid is introduced into and is evacuated from the fluid circulation block by fluid inlet and outlet arms 52, 54 swivelably attached to the sides of the TCU generally at or near the position of the fluid circulation block. Swivel attachments to the fluid inlet and outlet arms, in conjunction with compliant mounting of force distribution block 12 and the corner shafts 110, reduce instability of the thermal control unit due to external forces exerted on the TCU, and particularly due to biasing forces exerted by external hoses connected to the fluid inlet and outlet of the fluid circulation block. FIG. 1 depicts the exemplary range of motion for the swivel attachment of fluid outlet 54. The inlet and outlet arms preferably swivel about a common swivel axis S (shown in FIG. 2), and suitably have a swivel axis that is perpendicular to the z-axis of the TCU. While the fluid inlet arm 52 and fluid outlet arm 54 are shown attached opposite each other on opposite sides of the TCU, it is not intended that this swivel arm attachment aspect of the invention be limited to opposed swivel arms.

Thus, in accordance with this aspect of the invention, should any uncontrolled forces arise from hoses connected to the fluid inlet and outlet arms 52, 54 of the TCU, during a test cycle, the swivel action of the fluid inlet and outlet arms 52, 54 relative to the TCU will relieve these forces and cause z-axis alignment of the parts of the TCU to be maintained.

Any of a number of fluids may be circulated through fluid circulation block 50. Preferably, the fluids are provided in liquid form, but gaseous fluids may be used on occasion. Liquids having a relatively high heat capacity are particularly useful in certain application. In addition, the temperature-control fluids may be chosen according to desired conditions. For example, for testing of DUTs at ambient or elevated temperatures, e.g. 20° C. to about 65° C., water may serve as a temperature-control fluid. In contrast, cold testing of DUTs at −20° C., −5° C., 0° C., or temperatures therebetween may involve the use of aqueous solutions containing, methanol, ethylene glycol, or propylene glycol or nonaqueous liquids.

In still another aspect of the invention the thermal control unit 1 includes a condensation-abating system. The condensation-abating system includes a condensation-abating gas inlet 42, which can suitably be located at one edge of the inner spring loaded pusher block section 40 of the TCU. As shown in FIG. 3, gas inlet 42 connects to gas transporting passageways that extend around the pedestal 72, between the pedestal and the pedestal retaining ring 43, and between the pedestal retaining ring, pedestal and the outer pusher structure 80. The gas transporting passageways are denoted by the numerals 44A, 44B, 44C, 44D, 46A, 46B and 47. The condensation-abating system in further described below.

In use, the illustrated thermal control unit 1 may be placed over a test socket (not shown) containing a bare die chip package 100. A z-axis force is applied to the gimbal adapter 30, such as by a pneumatic press of an automated chip tester. The z-axis force is transferred by the force distribution block 12 of the self-centering gimbal 10 to pedestal 72 through the stack of thermal control blocks 40, 50 and 60 to the heat conducting pedestal 72, and to the outer pusher structure 80 though the force transfer shafts 110. The two pushers to which this z-axis force is transferred are the pusher end 76 of the pedestal which contacts the die 104 of the bare die chip package and the substrate pusher 72 of the outer pusher structure. The exerted z-axis force is controllably distributed between these pushers by the force distribution block 12. The force exerted on the die relative to the force exerted on the substrate can be adjusted by adjusting the pressure behind the pistons 18 of the force distribution block, which acts a z-axis force actuation means. The force distribution may be preset or adjusted on the fly such that the die force does not exceed a desired or predetermined upper limit to ensure that the die force does not damage the die.

It is noted that the z-axis distance between the pedestal pusher end 76 and the bottom substrate pusher end 82 should be calibrated to ensure the substrate force does not fall below a desire or predetermined lower limit to ensure proper engagement between electrical pads of the DUT and the probes of the test socket. For example, a manufacturer of a particular IC device in bare-die packaging may specify that the particular IC device be cold tested with the application of at least a 55 pound load to the substrate. However, the specification may also prohibit the die from experiencing a load of 15 pounds or greater. In such a case, a total load of 70 pounds may be applied to the DUT with the die pusher adjusted to limit the load applied to the die not to exceed 15 pounds.

When so engaged, testing may begin. The thermal measurement and control elements of the thermal control unit act to monitor and maintain the DUT's set point temperature. The DUT temperature may be monitored by the sensor 78 in the pedestal pusher end 76. A desired electrical signal is supplied to the Peltier device 60 from an external power source to generate the heat flow needed to maintain a desired set point temperature for the DUT in the test socket. Heat transfer between the pedestal and fluid circulating block 50 can be regulated in accordance with the temperature of the DUT as detected by the sensor 78, with heat being removed from the pedestal to the temperature-control fluid being circulated through the fluid block 50 when it is desired to lower the DUT temperature, and with heat being added to the pedestal 72 from the circulating fluid if the DUT temperature needs to be raised. In short, the heat is either carried away or supplied by the temperature-control fluid which is passed through the fluid passage within the fluid circulating block 50.

To help achieve an efficient interface, a thermal interface material, such as a thermal grease or foil, is optionally provided between the pedestal's top surface 74 and the Peltier device 60, and between the Peltier device and the fluid circulating block 50.

Regarding the condensation-abatement aspect of the invention, the DUTs of the invention may be used to carry out cold testing of DUTs. During such cold testing, temperature-control fluid may be chilled to temperatures of 0° C. or below. If such testing is carried out under uncontrolled ambient conditions, water or ice may accumulate on surface of the TCUs, DUTs, and test sockets. Such condensation is may short or otherwise interfere with the proper functioning the electronic components of TCUs, DUTs and test sockets.

A number of techniques known in the art have been used to address the condensation problems associated with cold testing. For example, high-volume cold testing of IC devices have been carried out in controlled environments, e.g., within rooms having a low level of atmospheric humidity. In some low-volume cold testing facilities, IC devices may be tested within an enclosure that maintains a low-humidity. In addition or in the alternative, plastic form of other material having a low thermal conductivity may be applied to surfaces of TCUs to address condensation problems associated with the chilling of components of TCUs engaged in cold testing.

In accordance with the condensation abatement aspect of the invention, provides a new and efficient approach to abatement of condensation on TCU and chip surfaces, which is integrated into the TCU. A condensation-abating gas is introduced under pressure into the TCU through gas inlet 42. The abating gas flushes through the TCU so as to pass over surfaces on which condensation is likely to occur. In particular, in illustrated embodiment and as shown in FIG. 3 the gas introduced at inlet 42 flows into horizontal passageway 44A and down through vertical passageway 44B and from there flushes through passageways 44C and 44D around the pedestal (including openings in the pedestal insulating ring 73), and exiting the TCU through two exit routes: through passageways 46A, 46B between parts of the outer pusher structure 80 and the pedestal retainer 43, which is preferably stainless steel, and through passageway 47 between the pusher end 76 of the pedestal 72 and the substrate pusher 82 of the outer pusher structure.

It will be appreciated that gas passageways may be provided in ways other than as shown. For example, passageway 44A extends generally horizontally through inner spring loaded pusher block 40 until it joins with passageway 44B in a fluid-communicating manner. Passageway 44B extends in a z-axis direction through a portion of block 40, as well as both the upper section 56 and lower section 58 of the fluid circulation block 50. Passageways 44C, 44D, 46A, 46B, and 47 are shown downstream from passageway 44B and located between the skirt 90 and the pedestal 72. Optionally, one or more additional passageways may be formed by placing a first surface having one or more channels formed therein against a second surface, the surfaces in combination defining the one or more additional passageways. For example, condensation abating gas transporting passageways may be integrated within or interposed between the modules of the inventive TCU.

In operation, a condensation-abating gas source (not shown) may be connected with inlet 42. Condensation-abating gas is introduced through the inlet 42, and flushed through the gas passageways as above-described, and flows over surfaces on which condensation may occur. As the pedestal 72 is necessarily cold during cold testing, skirt 90 may help direct condensation-abating gas over exposed surfaces of the pedestal prone to collect moisture or ice.

Any of a number of gases may be used. For example, any dry inert gas, e.g., nitrogen, helium, argon, etc. may be used. In particular, commercially available, dry, oil-free air has been demonstrated to abate condensation on the inventive TCU. TCUs having the above-described integrated means for abating condensation do not experience condensation-related problems during cold testing in uncontrolled atmospheric conditions, whereas the same TCU may suffer from condensation-related problems during cold testing when no condensation-abating gas is used.

In addition to the use of condensation-abating gas, appropriate measures should be taken to address heat conduction issues. For example, different components of the temperature control unit should be thermally isolated from one another whenever possible to inhibit chilling of water sensitive components of TCUs. In addition, material of low thermal conductivity should be used whenever possible. For example, metals should generally be avoided for components that do not have to conduct heat. As discussed above, portions of the temperature-control fluid block may be made from a metal such as copper for efficient heat conduction. However, other portions of the temperature-control fluid-block, e.g., those exposed to the surrounding ambient environment, may be formed from a material that does not conduct heat, e.g., plastic, to deter the formation of condensation thereon.

To facilitate discussion, FIGS. 6-11 illustrate another exemplary embodiment of a thermal control unit (TCU) 600 in accordance with the present invention. Advantages of this embodiment include a fast thermal response of 40° C./second for an IC device under test (DUT) have a test surface area of approximately 16 mm×16 mm, with a resulting watt density of approaching 1000 watts per square inch. In addition, TCU 600 has an operating range of −60° C. to 160° C.

Figure 7A:
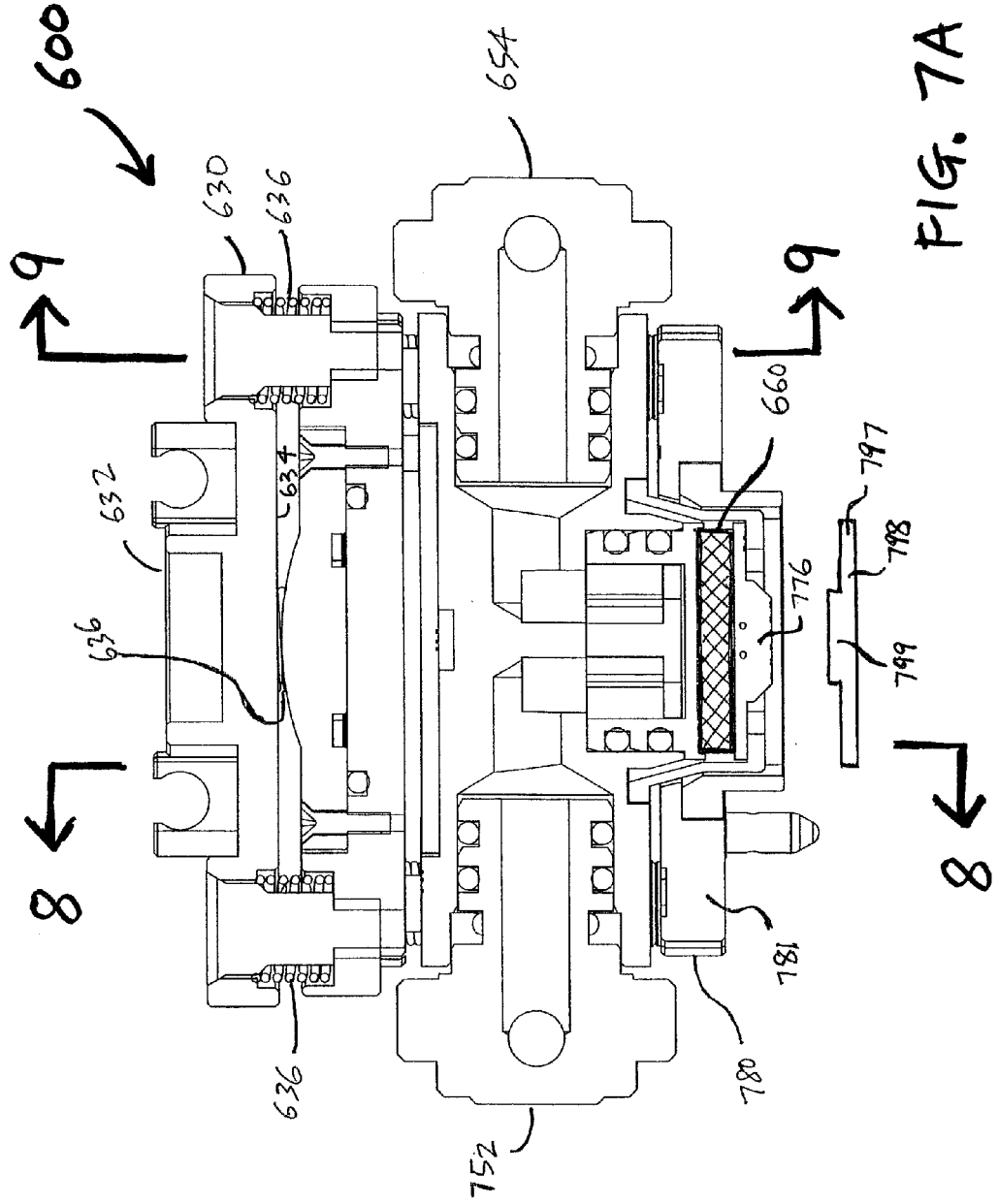
Figure 7B:
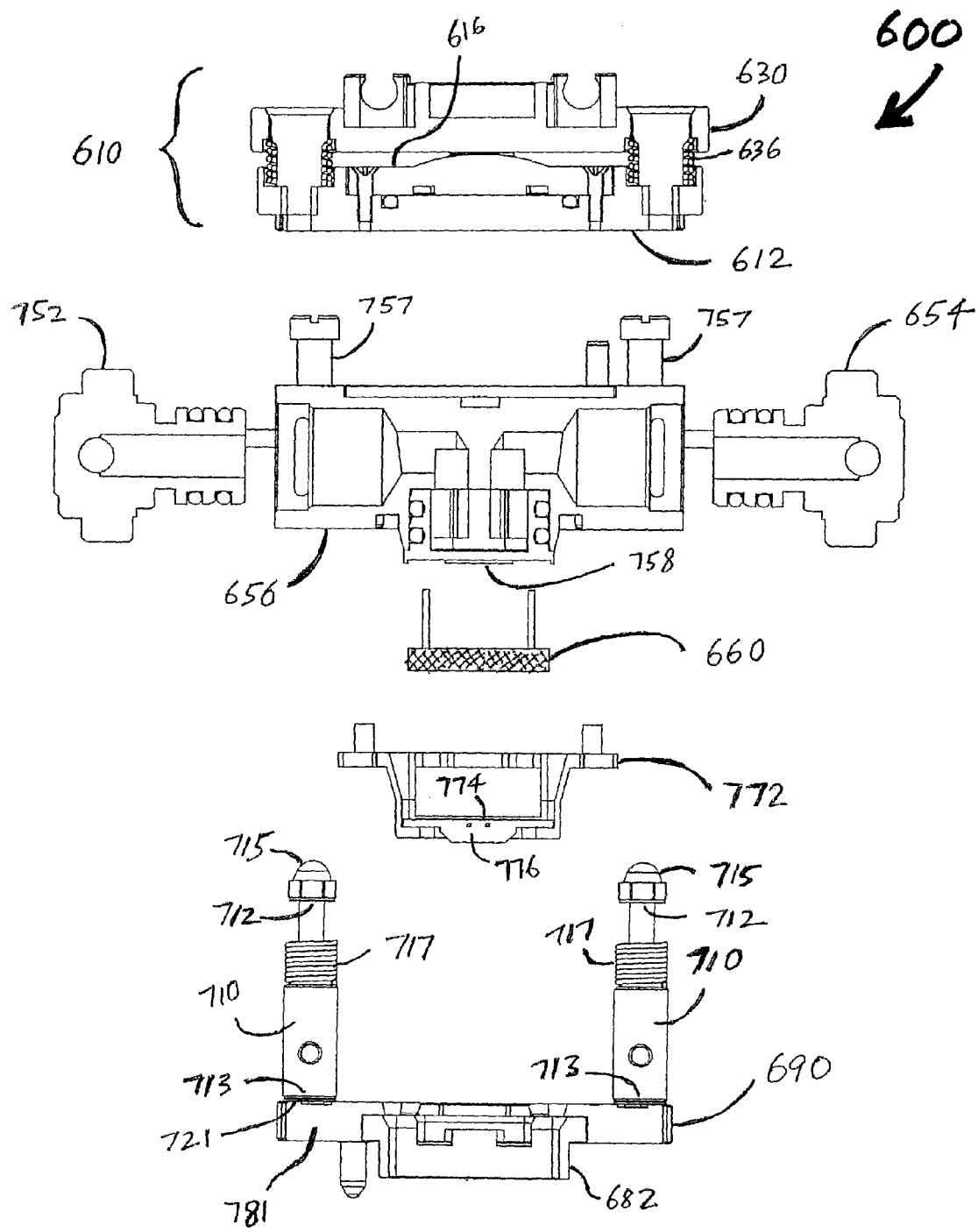
FIG. 7B is an exploded view of FIG. 7A.
Figure 8:
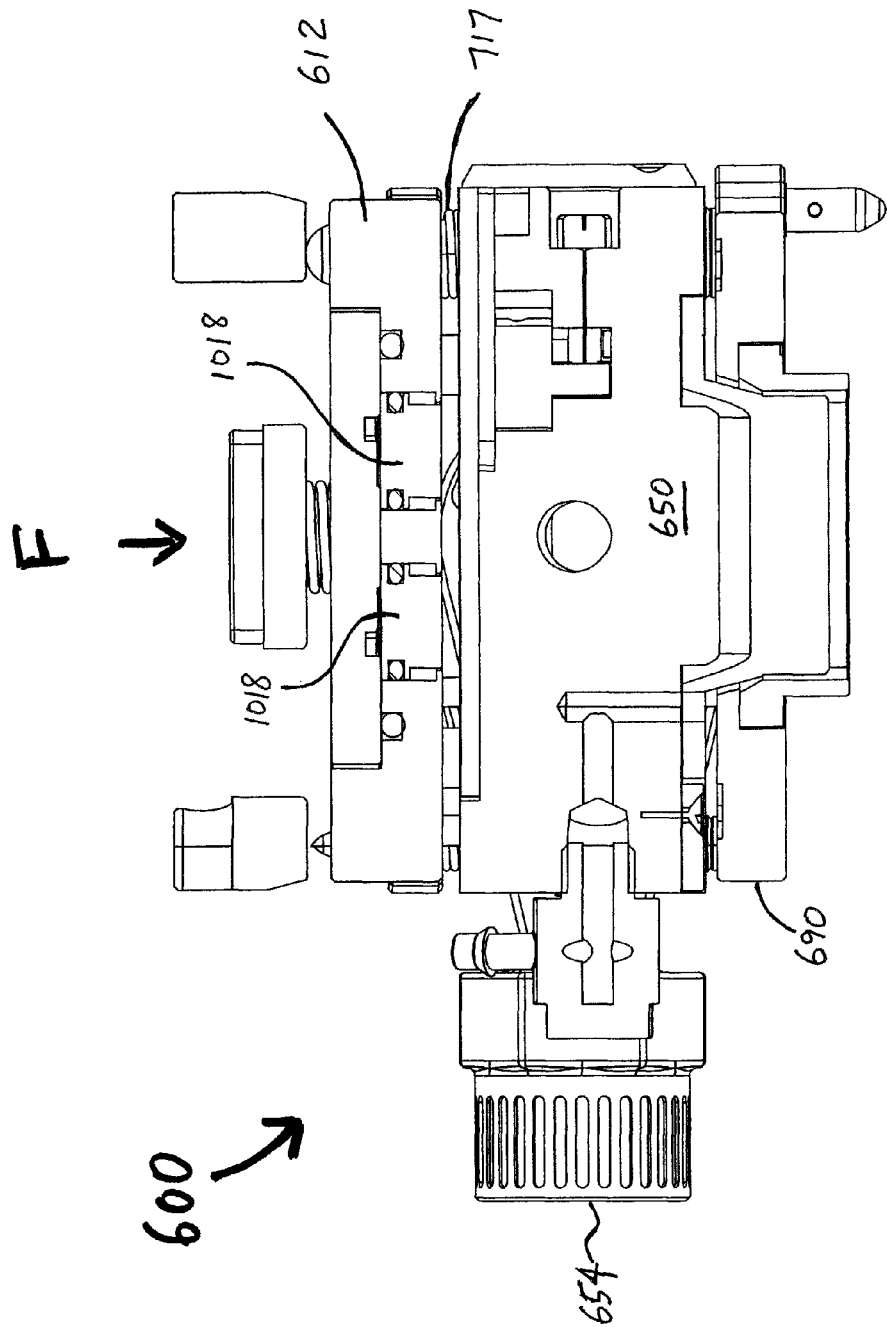
FIG. 8 is another cross-sectional view thereof taken along section lines 8-8 in FIG. 7A.
Figure 9:
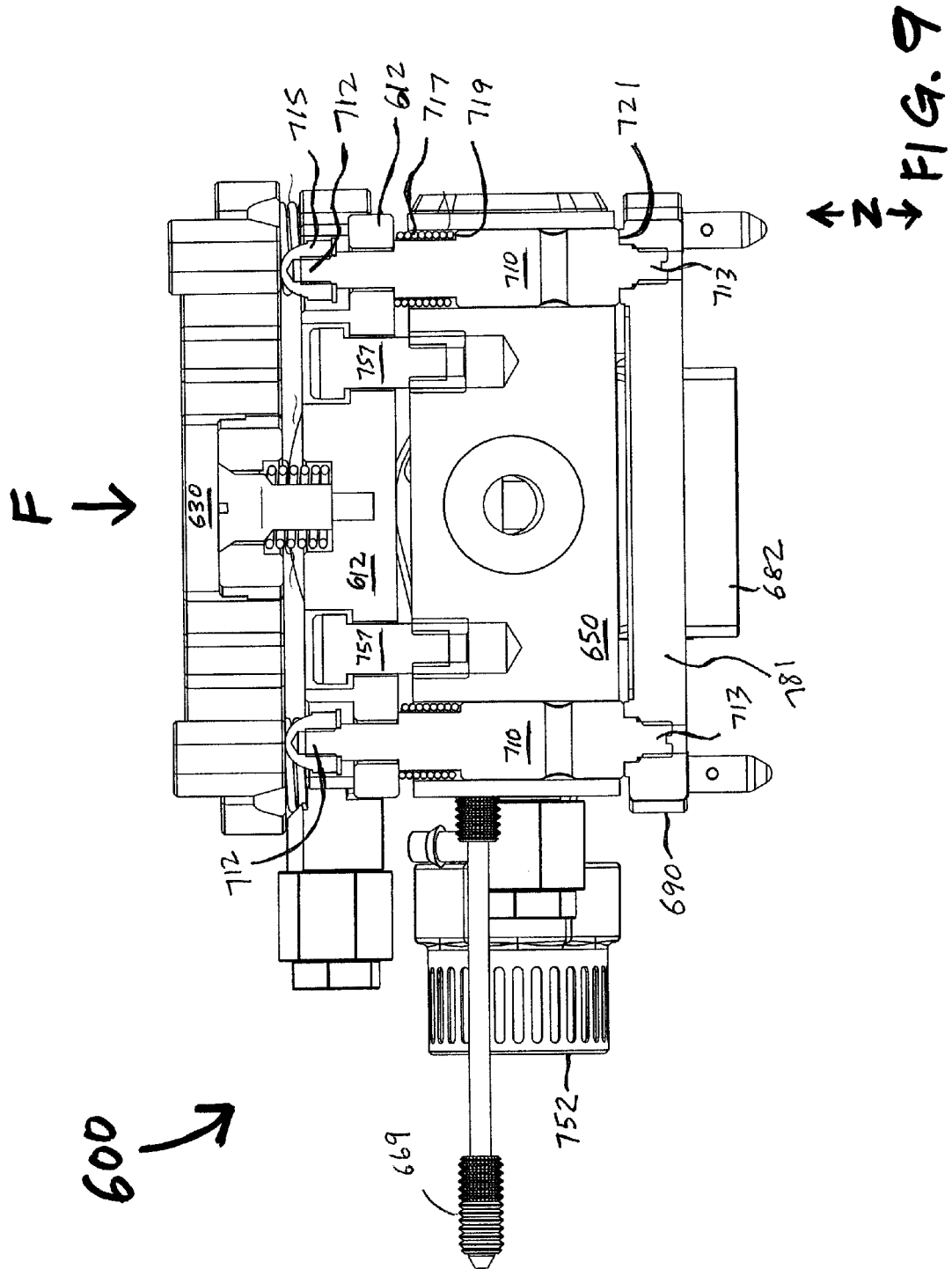
FIG. 9 is another cross-sectional view thereof taken along section lines 9-9 in FIG. 7A.
Figure 10A:
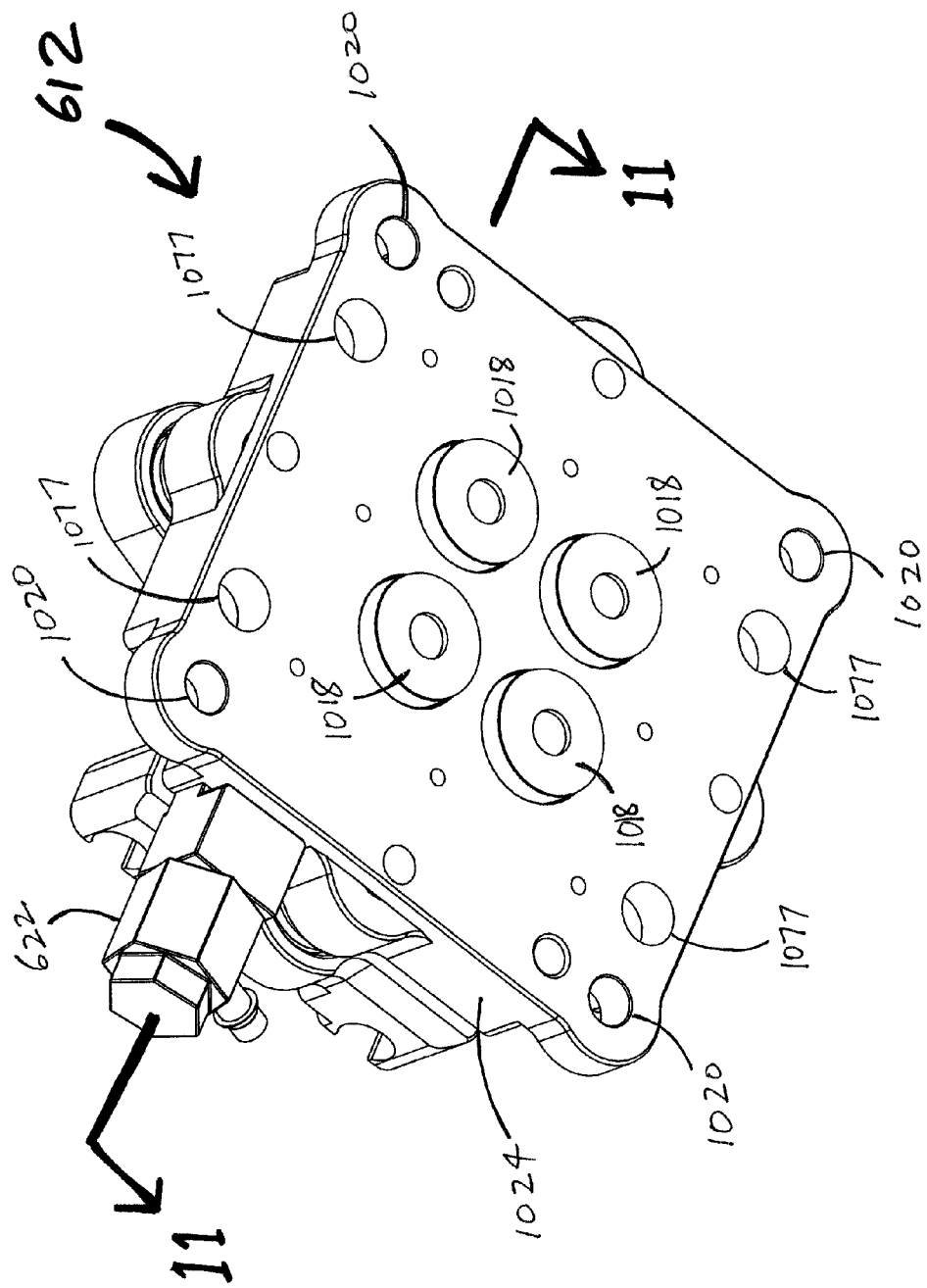
FIG. 10A is a bottom perspective view of an exemplary z-axis load distributor actuator block for the z-axis force distribution system of the TCU 600 shown in FIGS. 6-9.
Figure 10B:
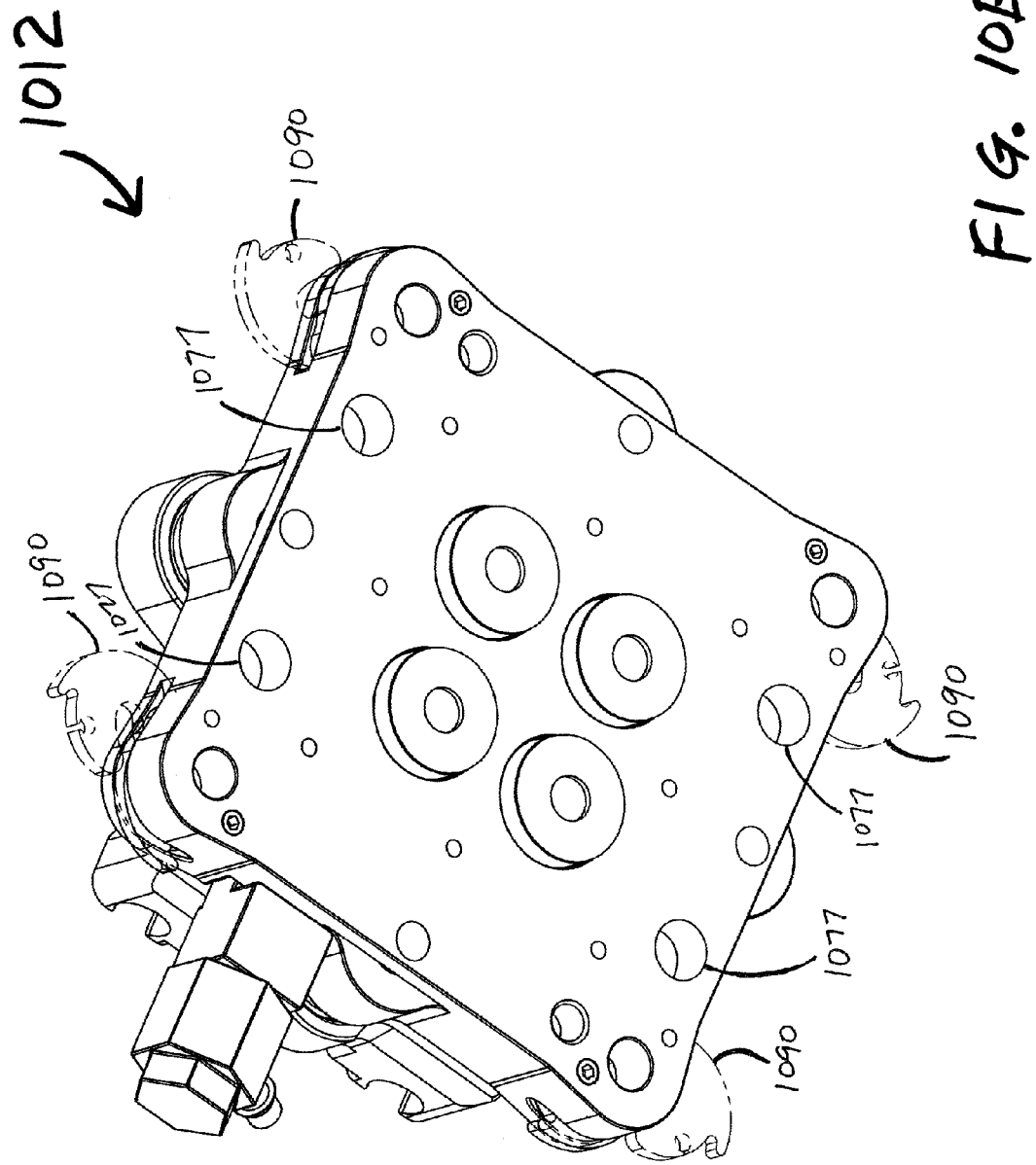
FIG. 10B is a bottom perspective view of an alternative embodiment of the z-axis load distributor actuator block of FIG. 10A.
Figure 11:
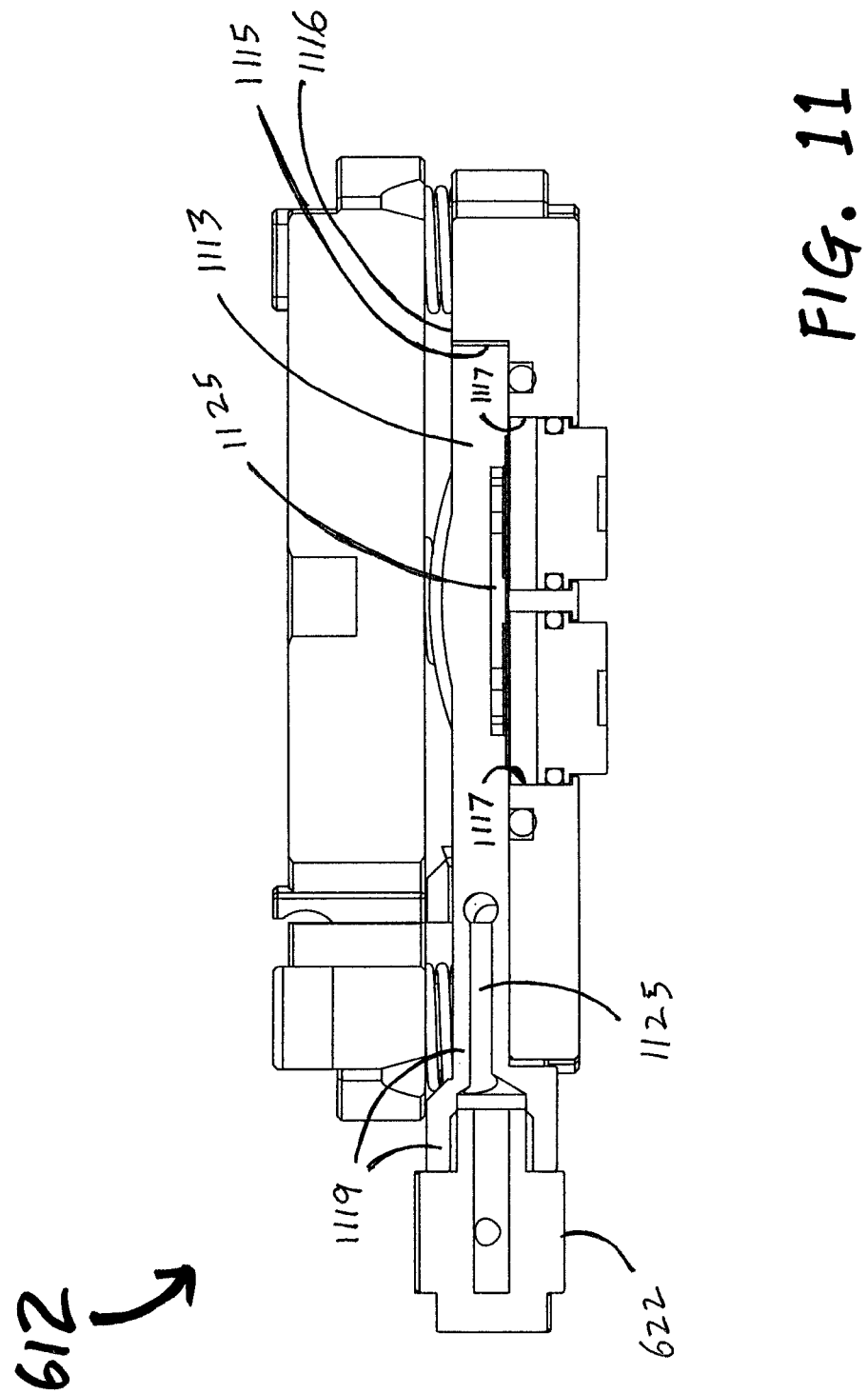
FIG. 11 is a cross-sectional view of the load distributor actuator block shown in FIG. 10A along the line 11-11, in combination with a spring loaded gimbal.

The superior thermal performance of TCU 600 is made possible by several key design features such as choices of thermal conductive materials, fluid and electrical pathways and thermal sensor locations, these design features described in greater detail below. Briefly, FIG. 6 is a side view of thermal control unit 600. FIG. 7A is cross-sectional view thereof taken along section lines 7A-7A in FIG. 6, while FIG. 7B is an exploded view of FIG. 7B illustrating the components of TCU 600, including force transmitting assembly 610, fluid circulation block (heat exchanger with thermally-conductive plate) 650, heater 660, pedestal 772, and substrate pusher 690. FIGS. 8 and 9 cross-sectional views thereof taken along section lines 8-8 and 9-9, respectively, in FIG. 7A. FIGS. 10A, 10B are bottom perspective views of two exemplary z-axis load distributor actuator blocks for the z-axis force distribution system of the TCU 600, while FIG. 11 is a cross-sectional view along the line 11-11 in FIG. 10A.

As shown in FIGS. 6-9, the thermal control unit (TCU) 600 includes the following basic sections arranged in stacked relationship along the z-axis of the TCU 600: a force transmitting assembly 610 for transmitted a z-axis force denoted by the arrow F (see FIG. 6) to the TCU's IC device under test (DUT) contacting pushers as hereinafter described; a fluid circulation block 650; a heater 660; and a heat conductive pedestal 772 having a pusher end 776, which includes at least one pedestal temperature sensor, for contacting and pushing against a thermally active central portion of an IC chip, such as the die 799 of a bare die chip package 797.

An outer pusher structure 780 is also provided. Pusher 780 includes a rigid bottom pusher plate 781 and is suitably fabricated of a metal material, such as aluminum, for rigidity. The bottom pusher plate 781 has a center opening to allow the pusher end of the heat conducting pedestal to project through the pusher plate. A second DUT contacting pusher 682 extends from the bottom of the pusher plate around this center opening. This second pusher 682 extends in the z-axis direction in parallel with the pusher end of the pedestal and contacts and pushes against another part of the IC chip, such as the substrate 798 of the bare die chip package 797.

Referring to FIG. 7A, the fluid circulation block (also known as the chiller block) 650 is seen to have a lower contact plate 758 at the bottom of block's main body 656. This lower contact plate 758 is made of a good heat conductor such as copper and is suitable provided to achieve efficient heat conduction between the fluid circulation block 650 and the heater 660. Hence the block's main body 656 of the may be formed from material that does not conduct heat as well as copper or other metals. Suitable materials for main body 656 include thermoplastics such as Peek™, Ultem™ or Torbn™, capable of withstanding repeated rapid thermal shock cycles and also reducing condensation abatement needs, during multiple rapid heating/cooling cycles of TCU 600.

To prevent thermal runaway and resulting damage to TCU 600, fluid circulation block 650 preferably includes at least one chiller temperature sensor, enabling TCU 600 to sense when permitted operating range has been exceeded and triggering an appropriate thermal cut off.

Referring also to FIG. 6, the force transmitting assembly 610 of the TCU 600 includes a force distribution block 612 and can additionally include a gimbal adapter 630 above the force distribution block 612 to form the force transmitting assembly 610. The gimbal adapter 630 includes upper and lower surfaces 632 and 634, with the upper surface 632 being positioned to receive the indicated z-axis force F. The gimbal adaptor 630 further includes springs 636 positioned beneath the lower surface 634. Springs 636 are held in compression between the gimbal adaptor 630 and the upper surface 616 of the force distribution block 612 for preload gimbal stability.

As shown in FIGS. 7A, 7B, 9 and 10A, the outer pusher structure 780 is secured to the force distribution block 612 by force transfer shafts 710. These shafts freely pass through suitably sized holes in the fluid circulation block 650. The bottom ends 713 of shafts 710 are suitably anchored to the pusher plate 781 near the outer perimeter of the plate, such as by threaded engagement, while the top ends 712 of the shafts extend through openings 1020 (shown in FIG. 10A) in the corners of the force distribution block and are topped by cap nuts 715 to retain the force distribution block on the shafts 710.

In addition, gimbal block 612 also includes suitably sized holes 1077 for coupling with a corresponding set of alignment pins 757 protruding vertically from the top surface of fluid circulation block 650.

FIGS. 7A and 9 both show the force distribution block 612 compliantly supported on springs 717 provided around the recessed portion of the shaft 710 beneath the force distribution block and which set on shoulders 719 presented by the recessed portion of the shaft 710. A z-axis force F applied to the force transmitting assembly 610 will thus be compliantly transmitted to pusher 682 of the outer pusher structure, and thus to the substrate 798 of bare die chip package 797. The springs 717 can be used to preload the force distribution block (gimbal block) 612 to the main body 656 of fluid circulation block 650.

It is noted that bottom shoulders 721 are provided near the bottom end 713 of each of the force transfer shafts 710. These shoulders rest against the rigid pusher plate 781 to maintain the perpendicularity of the shafts.

The z-axis force F is transmitted to the die 799 of bare die chip package 797 through the stacked thermal control sections of the TCU 600, namely, the fluid circulation block 650, heater 660, and the heat conductive pedestal 772, all of which must be secured together. The force transmitted to the pusher end of pedestal 772 is uniquely controlled by means in the force distribution block 612, which can be actuated to change the force transmitted to the thermally active part of the DUT through the pedestal relative to the force transmitted to another part of the DUT through the outer pusher structure parts 780, 682.

Referring to FIGS. 10A and 11, the force changing actuator for the force distribution block 612 (also known as the gimbal block), can be provided in the form of at least one and preferably a plurality of pistons 1018 nested in bottom surface 1014 of a gimbal block 612 for distributing the z-axis force.

Pistons 1018, which are preferably evenly spaced in a grouping centered in the bottom to the force distribution block 612, protrude from piston holes 1117 in the bottom of gimbal block 612 and can be actuated in the z-axis direction by altering fluid pressure behind the pistons 1018. Fluid pressure is provided to the pistons from fluid inlet 622 which protrudes from a side wall 1024 of gimbal block 612.

As shown in FIG. 11, the inlet 622 fluidly communicates with the pistons 1018 via fluid passageway 1125 within the gimbal block 612. The inlet 622 may be connected to a source of pressured gas or fluid to effect pneumatic actuation of the pistons 1018. Although pressured air is typically used, the pressured fluid may be nongaseous as well. For example, oils, water, or aqueous solutions may be used to actuate the pistons 1018. The result is pistons that produce a z-axis force that can be adjusted on the fly. By adjusting the pressures behind the pistons 1018, the force transferred to the heat conducting pedestal 772 relative to the force transmitted to the outer pusher 682 can be modified during testing of the DUT without unloading or disassembling the thermal control unit. Alternatively, the adjustable pistons may be preset before use.

The gimbal block 612 can be constructed for ease of loading the pistons 1018 in the block by providing a top cover plate 1113 that fits in a recess 1115 in the top surface 1116 of the block 612. The top cover plate 1113 can be secured in this recess 1115 by any suitable means such as by screw fasteners. The fluid passageways that are in communication with the piston holes 1117 can be formed on the underside of the block 612. The fluid inlet 622 can be a fluid line coupler attached, such as by a threaded attachment, to a fluid inlet extension 1119 of top cover plate 1113.

FIG. 10b shows an alternate embodiment of the gimbal block 1012, wherein instead of machine screws, pivoted latches 1090 are used to secure the stacked components of TCU 600 to each other without the need for tools.

Referring to both FIGS. 6 and 7A, the fluid circulation block 650 constructed fluid passages that enable fluids to be circulated through the block and carry heat away from the pedestal that contacts the thermally active part of the DUT, such as described in U.S. Pat. No. 7,663,388. In accordance with one aspect of the invention, fluid is introduced into and is evacuated from the fluid circulation block by fluid inlet and outlet arms 752, 654 swivelably attached to the sides of the TCU 600 generally at or near the position of the fluid circulation block. Swivel attachments to the fluid inlet and outlet arms, in conjunction with compliant mounting of force distribution block 612 and the corner shafts 710, reduce instability of the thermal control unit due to external forces exerted on the TCU 600, and particularly due to biasing forces exerted by external hoses connected to the fluid inlet and outlet of the fluid circulation block. FIG. 6 depicts the exemplary range of motion for the swivel attachment of fluid outlet arm 654. The inlet and outlet arms 752, 654 preferably swivel about a common swivel axis S (shown in FIG. 7A), and suitably have a swivel axis that is perpendicular to the z-axis of the TCU 600. While the fluid inlet arm 752 and fluid outlet arm 654 are shown attached opposite each other on opposite sides of the TCU 600, it is not intended that this swivel arm attachment aspect of the invention be limited to opposed swivel arms.

Thus, in accordance with this aspect of the invention, should any uncontrolled forces arise from hoses connected to the fluid inlet and outlet arms 752, 654 of the TCU 600, during a test cycle, the swivel action of the fluid inlet and outlet arms 752, 654 relative to the TCU 600 will relieve these forces and cause z-axis alignment of the parts of the TCU to be maintained.

Any of a number of fluids may be circulated through fluid circulation block 650. Preferably, the fluids are provided in liquid form, but gaseous fluids may be used on occasion. Liquids having a relatively high heat capacity are particularly useful in certain application. In addition, the temperature-control fluids may be chosen according to desired conditions. For example, for testing of DUTs at ambient or elevated temperatures, e.g. 20° C. to about 65° C., water may serve as a temperature-control fluid. In contrast, cold testing of DUTs at −20° C., −5° C., 0° C., or temperatures therebetween may involve the use of aqueous solutions containing, methanol, ethylene glycol, or propylene glycol or nonaqueous liquids.

In still another aspect of the invention the thermal control unit (TCU) 600 includes a condensation-abating system. During cold testing, temperature-control fluid may be chilled to temperatures of 0° C. or below. If such testing is carried out under uncontrolled ambient conditions, water or ice may accumulate on surface of the TCUs, DUTs, and test sockets. Such condensation is may short or otherwise interfere with the proper functioning the electronic components of TCUs, DUTs and test sockets.

Accordingly, the condensation-abating system includes a condensation-abating gas inlet 668, which can suitably be located at one edge of the fluid circulation block 650. As shown in FIGS. 6 and 7A, gas inlet 668 connects to gas transporting passageways that extend around the pedestal 772, in a manner similar to that of the other embodiment of TCU 1 described above, thereby enabling the approach to abatement of condensation on TCU and chip surfaces, described above for TCU 1 to be integrated into the TCU 600.

In addition to the use of condensation-abating gas, appropriate measures should be taken to address heat conduction issues. For example, different components of the temperature control unit should be thermally isolated from one another whenever possible to inhibit chilling of water sensitive components of TCUs. In addition, material of low thermal conductivity should be used whenever possible. For example, metals should generally be avoided for components that do not have to conduct heat. As discussed above, portions of the temperature-control fluid block may be made from a metal such as copper for efficient heat conduction. However, other portions of the temperature-control fluid-block, e.g., those exposed to the surrounding ambient environment, may be formed from a material that does not conduct heat, e.g., plastic, to deter the formation of condensation thereon.

In use, the illustrated thermal control unit 600 may be placed over a test socket (not shown) containing a bare die chip package 797. A z-axis force is applied to the gimbal adapter 630, such as by a pneumatic press of an automated chip tester. The z-axis force is transferred by the force distribution block 612 of the self-centering gimbal 610 to pedestal 772 through the stack of thermal control subassemblies 650 and 660 to the heat conducting pedestal 772, and to the outer pusher structure 780 though the force transfer shafts 710. The two pushers to which this z-axis force is transferred are the pusher end 976 of the pedestal which contacts the die 798 of the bare die chip package 799 and the substrate pusher 690 of the outer pusher structure.

The exerted z-axis force is controllably distributed between these pushers by the force distribution block 612. The force exerted on the die 799 relative to the force exerted on the substrate 798 can be adjusted by adjusting the pressure behind the pistons 1018 of the force distribution block, which acts a z-axis force actuation means. The force distribution may be preset or adjusted on the fly such that the die force does not exceed a desired or predetermined upper limit to ensure that the die force does not damage the die 799. In other words, the total z-axis force exerted by force distribution block 612 is equal to a sum of the force exerted on the substrate 798 and the force exerted on the die 799. This force distribution between the substrate 798 and the die 799 is carefully controlled so that no undue internal structural stress, caused by harmful bending forces, is transmitted by the TCU 600 to the DUT, while maintaining efficient thermal conductivity between the TCU 600 and the DUT during the test.

It is noted that the z-axis distance between the pedestal pusher end 776 and the bottom substrate pusher end 682 should be calibrated to ensure the substrate force does not fall below a desire or predetermined lower limit to ensure proper engagement between electrical pads of the DUT and the probes of the test socket. For example, a manufacturer of a particular IC device in bare-die packaging may specify that the particular IC device be cold tested with the application of at least a 55 pound load to the substrate 798. However, the specification may also prohibit the die 799 from experiencing a load of 15 pounds or greater. In such a case, a total load of 70 pounds may be applied to the DUT with the die pusher 776 adjusted to limit the load applied to the die not to exceed 15 pounds.

When so engaged, testing may begin. The thermal measurement and control elements of the thermal control unit act to monitor and maintain the DUT's set point temperature. The DUT temperature may be monitored by the pedestal thermal sensor in the pedestal pusher end 776.

A desired electrical current is supplied to the heater 660 from an external power source to generate the heat flow needed to maintain a desired set point temperature for the DUT in the test socket. Heat transfer between the pedestal 772 and fluid circulating block 650 can be regulated in accordance with the temperature of the DUT as detected by the thermal sensor 778, with heat being removed from the pedestal 772 to the temperature-control fluid being circulated through the fluid block 650 when it is desired to lower the DUT temperature. It is also possible to add supplement heat generated by the heater 660 to the pedestal 772 with additional heat from the circulating fluid if the DUT temperature needs to be raised rapidly. In short, the heat is either carried away or supplied by the temperature-control fluid which is passed through the fluid passage within the fluid circulating block 650.

As discussed above, although fluid circulating block 650 can be made from a suitable thermo-plastic to reduce condensation, while the thermally-conductive plate 758 is made from a relatively-thin (low-mass) and highly-conductive material, such as nickel-plated copper, for superior thermal transfer performance. Similarly, the electrically-resistive heater 660 can be made from suitable materials, including ceramic materials such as AN (aluminum nitride), which is has suitable thermally-conductive properties.

To further improve the efficiency of the various thermal interfaces, a suitable thermal interface material, such as a thermal grease or foil, e.g., "Artic-Silver™ thermal compound, can be provided between the pedestal's top surface 774 the heater 660, and between the heater 660 and the thermally-conductive plate 758 located at the bottom of fluid circulating block 650. This thermal interface material, typically about one mil in thickness, fills out minor imperfections and voids, thereby enhancing thermal conductivity and efficiency of the respective interfaces. In addition, the thermal interface material also accommodates the different expansion coefficients of the corresponding components made from different materials, namely, the plate 758, the heater 660 and the pedestal 772 during rapid heating and cooling cycles.

In some embodiments, in order to improve the thermal efficiency of interface between the pedestal pusher end 776 and the die 799, a suitable liquid thermal interface material (LTIM), for example water and glycerin, is injected under pressure into the pedestal/die interface from one or more perforations located at the bottom of pedestal pusher end 776. Subsequently, after the testing of the DUT, residual LTIM is removed under suction from the same bottom perforations of the pedestal pusher end 776. The LTIM is supplied to and removed from pedestal pusher end 776 via a corresponding set of LTIM input and output 669 shown in FIGS. 6 and 9.

It will be apparent to those of ordinary skill in the art that the invention may be embodied in various forms and that the invention. For example, the materials used for fabricating the components of the thermal control unit would be readily apparent to persons skilled in the art upon review of the disclosure contained herein to ensure that the proper component functioning under the forces and temperatures required for IC device testing. Similarly, those of ordinary skill in the art, upon review of the disclosure contained herein and through routine experimentation, will be able to distinguish optional versus critical elements of the invention for different contexts. For example, those of ordinary skill in the art will recognize that the invention may require only one pusher in some instances, but may require a plurality of pushers in other.

It is to be understood that while the invention has been described in conjunction with the preferred specific embodiments thereof, that the foregoing description is intended to illustrate and not limit the scope of the invention. For example, while the above description has focused on a TCU for IC devices with bare die packaging, the invention is not limited to such packaging. Accordingly, the above-described pistons, swivelable inlet and outlet arms, and condensation abating means as described above may be used for TCUs constructed for testing lidded die packages as well as bare die packages. In addition, the invention is not limited to force-providing means having a construction as shown in the drawing. Those of ordinary skill in the art, upon review of the disclosure contained herein may devise various differ force-providing means for receiving a total z-axis force and controllably distributing the total z-axis force on different parts of IC packages. In any case, aspects of different embodiments of the invention may be included or excluded from other embodiments. Other aspects, advantages and modifications within the scope of the invention will be apparent to those skilled in the art to which the invention pertains.

Hence, while this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A thermal control unit for maintaining a set point temperature on an IC device under test (DUT) having a substrate having a die attached to an upper surface thereof, comprising:
a pedestal assembly comprising a heat-conductive pedestal having a bottom end configured to contact the die of the DUT and a temperature sensor in the bottom end for monitoring the die's temperature;
a temperature-control fluid circulation block having a fluid inlet and a fluid outlet configured to circulate a fluid therethrough, the block in stacked relationship along an z-axis with the heat conductive pedestal;

a thermally-conductive heater between the heat-conductive pedestal and the fluid circulation block configured to provide heat to the pedestal, and further configured to transfer heat from the pedestal to the fluid circulation block;

a substrate pusher configured to contact the substrate of the DUT; and a controllable force distributor configured to receive a z-axis force and controllably distribute such z-axis force between the pedestal assembly and the substrate pusher, wherein said controllable force distributor includes a force distribution block having an actuator configured to change the force transmitted to the heat conductive pedestal relative to the force transmitted to substrate pusher, wherein the actuator for changing the force transmitted to the heat conductive pedestal relative to the force transmitted to substrate pusher includes a plurality of pistons that can be actuated to exerted a z-axis force that is transmitted to the pedestal and that changes the balance of the z-axis forces transmitted to the pedestal and the substrate pusher, and wherein the plurality of pistons are adjustable and capable of providing varying levels of die force.

2. The thermal control unit of claim 1 wherein the actuator includes at least one piston in the force distribution block that can be actuated to exerted a z-axis force that is transmitted to the pedestal and that changes the balance of the z-axis forces transmitted to the pedestal and the substrate pusher.

3. The thermal control unit of claim 1 wherein the pedestal includes at least one perforation configured to inject a liquid thermal interface material into an interface formed when the pedestal is on contact with the die.

4. The thermal control unit of claim 1 wherein the adjustable pistons are adjustable upon the force distributor receiving the z-axis force.

5. The thermal control unit of claim 1 wherein the adjustable pistons may be preset before the force distributor receives the z-axis force.

6. The thermal control unit of claim 1 wherein at least one of the fluid inlet and the fluid outlet is swivelable thereby reducing instability of the thermal control unit in response to z-axis movement of the fluid circulation block.

7. The thermal control unit of claim 1 wherein the pedestal assembly and the fluid circulation block are removably coupled to each other via a plurality of shafts.

8. The thermal control unit of claim 1 further comprising a condensation abating inlet and at least one condensation abating passageway terminating at or near at least one surface of the thermal control unit.

9. The thermal control unit of claim 8 further comprising a condensation abating skirt that circumscribes at least the bottom end of the pedestal.

* * * * *